(12) United States Patent
Zhang et al.

(10) Patent No.: US 10,657,865 B2
(45) Date of Patent: May 19, 2020

(54) REFERENCE VOLTAGE CIRCUIT, REFERENCE VOLTAGE SUPPLY MAIN CIRCUIT, AND DISPLAY DEVICE

(71) Applicant: BOE TECHNOLOGY GROUP CO., LTD., Beijing (CN)

(72) Inventors: Baoxia Zhang, Beijing (CN); Ling Wang, Beijing (CN); Cuili Gai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/174,848

(22) Filed: Oct. 30, 2018

(65) Prior Publication Data
US 2019/0164464 A1    May 30, 2019

(30) Foreign Application Priority Data
Nov. 24, 2017   (CN) .......................... 2017 1 1192573

(51) Int. Cl.
*G09G 3/20* (2006.01)
*H01L 27/02* (2006.01)
*H01L 27/12* (2006.01)
*G05F 3/08* (2006.01)
*G02F 1/1362* (2006.01)

(52) U.S. Cl.
CPC ......... *G09G 3/20* (2013.01); *G02F 1/136204* (2013.01); *G05F 3/08* (2013.01); *H01L 27/0266* (2013.01); *H01L 27/0288* (2013.01); *H01L 27/0296* (2013.01); *G09G 2330/04* (2013.01); *H01L 27/124* (2013.01)

(58) Field of Classification Search
None
See application file for complete search history.

*Primary Examiner* — Aneeta Yodichkas
(74) *Attorney, Agent, or Firm* — Brooks Kushman P.C.

(57) ABSTRACT

A reference voltage circuit, a reference voltage supply main circuit and a display device are provided. The reference voltage circuit includes N first voltage lines and M second voltage lines configured to receive first and second voltages, respectively, and a resistance circuit including M resistors. A m-th resistor includes P first sub-resistors, and first and second terminals of a p-th one of the first sub-resistors is connected to a p-th one of the first voltage lines and a m-th one of the second voltage lines; a resistance value of each first sub-resistor is larger than that of each first voltage line, P is a positive integer smaller than or equal to N, m is a positive integer smaller than or equal to M, and p is a positive integer smaller than or equal to P.

17 Claims, 5 Drawing Sheets

REFERENCE VOLTAGE CIRCUIT, REFERENCE VOLTAGE SUPPLY MAIN CIRCUIT, AND DISPLAY DEVICE

CROSS-REFERENCE TO RELATED APPLICATION

This application claims priority to Chinese Patent Application No. 201711192573.9 filed on Nov. 24, 2017, which is incorporated herein by reference in its entirety.

TECHNICAL FIELD

The present disclosure relates to a field of display technology, and in particular, to a reference voltage circuit, a reference voltage supply main circuit, and a display device.

BACKGROUND

A relevant reference voltage supply main circuit includes a reference voltage supply unit, data-line reference voltage lines and gate-line reference voltage lines. By configuring the data-line reference voltage lines as high-resistance lines, data-line reference voltages provided to the data-line reference voltage lines and gate-line reference voltages provided to the gate-line reference voltage lines may be different.

However, when the relevant reference voltage supply main circuit operates, the data-line reference voltages supplied to data-line electro-static discharge (ESD) circuits by the data-line reference voltage supply lines differ substantially, causing a protection effect of an electro-static discharge to be unreliable.

SUMMARY

The present disclosure provides a reference voltage circuit, a reference voltage supply main circuit and a display device.

In a first aspect, the present disclosure provides a reference voltage circuit. The reference voltage circuit includes N first signal-line reference voltage lines, M second signal-line reference voltage lines, and a resistance circuit, wherein both N and M are positive integers, and at least one of (i) or (ii): (i) the N first signal-line reference voltage lines are configured to receive N first signal-line reference voltages, respectively; the resistance circuit includes M resistors; a m-th resistor of the M resistors includes P first sub-resistors, and a first terminal of a p-th first sub-resistor of the P first sub-resistors is connected to a p-th first signal-line reference voltage line of the N first signal-line reference voltages lines, and a second terminal of the p-th first sub-resistor is connected to a m-th second signal-line reference voltage line of the M second signal-line reference voltage lines; a resistance value of each of the P first sub-resistors is larger than a resistance value of each of the N first signal-line reference voltage lines, P is a positive integer smaller than or equal to N, m is a positive integer smaller than or equal to M, and p is a positive integer smaller than or equal to P; or (ii) the M second signal-line reference voltage lines are configured to receive M second signal-line reference voltages, respectively; the resistance circuit includes N resistors; a n-th resistor of the N resistors includes Q second sub-resistors, and a first terminal of a q-th second sub-resistor of the Q second sub-resistors is connected to a n-th first signal-line reference voltage line of the N first signal-line reference voltages lines, and a second terminal of the q-th second sub-resistor is connected to a q-th second signal-line reference voltage line of the M second signal-line reference voltage lines; a resistance value of each of the Q second sub-resistors is larger than a resistance value of each of the M second signal-line reference voltage lines, wherein Q is an integer smaller than or equal to M, n is a positive integer smaller than or equal to N, and q is a positive integer smaller than or equal to Q.

Optionally, each of the first sub-resistors includes a first conductive wire, and each of the second sub-resistors includes a second conductive wire.

Optionally, N equals to 1, M equals to 1, and the resistance circuit includes one resistor, and at least one of (i) or (ii): (i) the first signal-line reference voltage line is configured to receive the first signal-line reference voltage; the resistor includes a first sub-resistor, a first terminal of the first sub-resistor is connected to the first signal-line reference voltage line, and a second terminal of the first sub-resistor is connected to the second signal-line reference voltage line; or, (ii) the second signal-line reference voltage line is configured to receive the second signal-line reference voltage; the resistor includes a second sub-resistor, a first terminal of the second sub-resistor is connected to the first signal-line reference voltage line, and a second terminal of the second sub-resistor is connected to the second signal-line reference voltage line.

Optionally, N equals to 1 and M equals to 2, the first signal-line reference voltage line is configured to receive the first signal-line reference voltage; the resistance circuit includes a first resistor and a second resistor, the first resistor includes a first first sub-resistor and the second resistor includes a second first sub-resistor; a first terminal of the first first sub-resistor is connected to the first signal-line reference voltage line, and a second terminal of the first first sub-resistor is connected to a first one of the two second signal-line reference voltage lines; a first terminal of the second first sub-resistor is connected to the first signal-line reference voltage line, and a second terminal of the second first sub-resistor is connected to a second one of the two second signal-line reference voltage line.

Optionally, N equals to 1 and M equals to 2; the two second signal-line reference voltage lines are configured to receive the second signal-line reference voltages, respectively; the resistance circuit includes one resistor, the resistor includes a second sub-resistor; a first terminal of the second sub-resistor is connected to the first signal-line reference voltage line, and a second terminal of the second sub-resistor is connected to one of the two second signal-line reference voltage lines.

Optionally, N equals to 1 and M equals to 2; the two second signal-line reference voltage lines are configured to receive the second signal-line reference voltages, respectively, and the resistance circuit includes a resistor, and the resistor includes a first second sub-resistor and a second second sub-resistor; a first terminal of the first second sub-resistor is connected to the first signal-line reference voltage line, and a second terminal of the first second sub-resistor is connected to a first one of the two second signal-line reference voltage lines; a first terminal of the second second sub-resistor is connected to the first signal-line reference voltage line, and a second terminal of the second second sub-resistor is connected to a second one of the two second signal-line reference voltage lines.

Optionally, N equals to 2 and M equals to 1; the two first signal-line reference voltage lines are configured to receive the first signal-line reference voltages, respectively; the resistance circuit includes a resistor, the resistor includes a first sub-resistor; a first terminal of the first sub-resistor is connected to one of the first signal-line reference voltage lines, and a second terminal of the first sub-resistor is connected to the second signal-line reference voltage line.

Optionally, N equals to 2 and M equals to 1; the two first signal-line reference voltage lines are configured to receive the first signal-line reference voltages, respectively; the resistance circuit includes a resistor, the resistor includes a first first sub-resistor and a second first sub-resistor; a first terminal of the first first sub-resistor is connected to a first one of the first signal-line reference voltage lines, and a second terminal of the first first sub-resistor is connected to the second signal-line reference voltage line; a first terminal of the second first sub-resistor is connected to a second one of the first signal-line reference voltage lines, and a second terminal of the second first sub-resistor is connected to the second signal-line reference voltage line.

Optionally, N equals to 2 and M equals to 1; the second signal-line reference voltage line is configured to receive the second signal-line reference voltage; the resistance circuit includes a first resistor and a second resistor; the first resistor includes a first second sub-resistor, and the second resistor includes a second second sub-resistor; a first terminal of the first second sub-resistor is connected to a first one of the first signal-line reference voltage lines, and a second terminal of the first second sub-resistor is connected to the second signal-line reference voltage line; a first terminal of the second second sub-resistor is connected to a second one of the first signal-line reference voltage lines, and a second terminal of the second second sub-resistor is connected to the second signal-line reference voltage line.

Optionally, N equals to 2 and M equals to 2; the two first signal-line reference voltage lines are configured to receive the first signal-line reference voltages, respectively; the resistance circuit includes a first resistor and a second resistor; the first resistor includes a first first sub-resistor and a second first sub-resistor; the second resistor includes a third first sub-resistor and a fourth first sub-resistor; a first terminal of the first first sub-resistor is connected to a first one of the first signal-line reference voltage lines, and a second terminal of the first first sub-resistor is connected to a first one of the second signal-line reference voltage lines; a first terminal of the second first sub-resistor is connected to the first one of the first signal-line reference voltage lines, and a second terminal of the second first sub-resistor is connected to a second one of the second signal-line reference voltage lines; a first terminal of the third first sub-resistor is connected to a second one of the first signal-line reference voltage lines, and a second terminal of the third first sub-resistor is connected to the first one of the second signal-line reference voltage lines; and a first terminal of the fourth first sub-resistor is connected to the second one of the first signal-line reference voltage lines, and a second terminal of the fourth first sub-resistor is connected to the second one of the second signal-line reference voltage lines.

Optionally, N equals to 2 and M equals to 2; the two second signal-line reference voltage lines are configured to receive the second signal-line reference voltages, respectively; the resistance circuit includes a first resistor and a second resistor; the first resistor includes a first second sub-resistor and a second second sub-resistor; the second resistor includes a third second sub-resistor and a fourth second sub-resistor; a first terminal of the first second sub-resistor is connected to a first one of the first signal-line reference voltage lines, and a second terminal of the first second sub-resistor is connected to a first one of the second signal-line reference voltage lines; a first terminal of the second second sub-resistor is connected to the first one of the first signal-line reference voltage lines, and a second terminal of the second second sub-resistor is connected to a second one of the second signal-line reference voltage lines; a first terminal of the third second sub-resistor is connected to a second one of the first signal-line reference voltage lines, and a second terminal of the third second sub-resistor is connected to the first one of the second signal-line reference voltage lines; a first terminal of the fourth second sub-resistor is connected to the second one of the first signal-line reference voltage lines, and a second terminal of the fourth second sub-resistor is connected to the second one of the second signal-line reference voltage lines.

Optionally, at least one of (i) the first signal-line reference voltages or (ii) the second signal-line reference voltages are supplied by a reference voltage supply circuit.

Optionally, the first conductive wire included in the each of the first sub-resistors is connected to one of the first signal-line reference voltage lines or one of the second signal-line reference voltage lines through a contact hole, and the second conductive wire included in the each of the second-resistors is connected to one of the first signal-line reference voltage lines or one of the second signal-line reference voltage lines through a contact hole.

In a second aspect, the present disclosure provides a reference voltage supply main circuit applied in a display device. The reference voltage supply main circuit includes a reference voltage supply circuit; and the reference voltage circuit according to the first aspect; the reference voltage supply circuit is connected to at least one of (i) the N first signal-line reference voltage lines or (ii) the M second signal-line reference voltage lines, and is configured to perform at least one of (i) supplying the N first signal-line reference voltages to the N first signal-line reference voltage lines, respectively, or (ii) supplying the M second signal-line reference voltages to the M second signal-line reference voltage lines, respectively.

In a third aspect, the present disclosure provides a display device. The display device includes the reference voltage supply main circuit according to the second aspect.

Optionally, the display device further includes a plurality of first signal lines, a plurality of second signal lines, a plurality of first signal-line electro-static discharge circuits, and a plurality of second signal-line electro-static discharge circuits; the plurality of first signal-line electro-static discharge circuits are connected to the plurality of first signal lines and the N first signal-line reference voltage lines; the plurality of second signal-line electro-static discharge circuits are connected to the plurality of second signal lines and the M second signal-line reference voltage lines.

Optionally, the N first signal-line reference voltage lines are arranged at at least one of a first side or a second side of a display panel in the display device, and the N first signal-line reference voltage lines are data-line reference voltage lines; and the first side is opposite to the second side; the M second signal-line reference voltage lines are arranged at at least one of a third side or a fourth side of the display panel in the display device, the M second signal-line reference voltage lines are gate-line reference voltage lines; and the third side is opposite to the fourth side.

DETAILED DESCRIPTION

Technical solutions of some embodiments of the present disclosure will be described clearly and completely hereinafter in conjunction with drawings of the embodiments in the present disclosure. Obviously, the described embodiments are only part, but not all, of the embodiments of the present disclosure. All other embodiments obtained by one skilled in the art without paying any creative labor based on the embodiments of the present disclosure fall into the scope of the present disclosure.

The present disclosure provides a reference voltage circuit, a reference voltage supply main circuit, and a display device. The technical solution of the present disclosure may reduce voltage-drops of different signal-line reference voltage lines when providing different reference voltages to the signal-line reference voltage lines.

Some embodiments of the present disclosure provide a reference voltage circuit. The reference voltage circuit includes N first signal-line reference voltage lines and M second signal-line reference voltage lines, wherein both N and M are positive integers; the reference voltage circuit further includes a resistance circuit; the N first signal-line reference voltage lines are configured to receive N first signal-line reference voltages supplied from a reference voltage supply circuit, respectively; the resistance circuit includes M resistors; a m-th resistor of the M resistors includes P first sub-resistors, and a first terminal of a p-th first sub-resistor of the P first sub-resistors is connected to a p-th first signal-line reference voltage line of the N first signal-line reference voltages lines, and a second terminal of the p-th first sub-resistor is connected to a m-th second signal-line reference voltage line of the M second signal-line reference voltage lines; a resistance value of each of the P first sub-resistors is larger than a resistance value of each of the N first signal-line reference voltage lines, wherein P is an integer smaller than or equal to N, m is a positive integer smaller than or equal to M, and p is a positive integer smaller than or equal to P; or, the M second signal-line reference voltage lines are configured to M receive second signal-line reference voltages supplied from the reference voltage supply circuit, respectively; the resistance circuit includes N resistors; a n-th resistor of the N resistors includes Q second sub-resistors, and a first terminal of a q-th second sub-resistor of the Q second sub-resistors is connected to a n-th first signal-line reference voltage line of the N first signal-line reference voltages lines, and a second terminal of the q-th second sub-resistor is connected to a q-th second signal-line reference voltage line of the M second signal-line reference voltage lines; a resistance value of each of the Q second sub-resistors is larger than a resistance value of each of the M second signal-line reference voltage lines, wherein Q is an integer smaller than or equal to M, n is a positive integer smaller than or equal to N, and q is a positive integer smaller than or equal to Q.

In some embodiments of the present disclosure, the reference voltage circuit further includes the resistance circuit including sub-resistors arranged between the first signal-line reference voltage lines and the second signal-line reference voltage lines and having relatively larger resistance values. Thus, after the first signal-line reference voltage lines are supplied with electrical voltages, the second signal-line reference voltage lines obtain different reference voltages, or after the second signal-line reference voltage lines are supplied with electrical voltages, the first signal-line reference voltage lines obtain different reference voltages. Since the resistance value of each of the first signal-line reference voltage lines or the second signal-line reference voltage lines is designed to be small, a voltage drop of each of the first signal-line reference voltage lines or the second signal-line reference voltage lines is not significant, and the protection effect of Electro-Static Discharge (ESD) is more reliable.

In an actual implementation, each of the first sub-resistors may include a first conductive line, and each of the second sub-resistors may include a second conductive line, so that the resistance value of each of the first sub-resistors and the resistance value of each of the second sub-resistors may be relatively large and a footprint of the first sub-resistors and a footprint of the second sub-resistors may be saved. It should be understood that the first conductive line or the second conductive line provided in the present disclosure may be a conductive line of any shape and capable of increasing a resistance value of the first sub-resistor or the second sub-resistor. For example, the first conductive line or the second conductive line may be a conductive zigzag line, a conductive fret line, a conductive coil, or the like.

In a first specific implementation, N equals to 1, and M equals to 1, and the resistance circuit includes one resistor. The first signal-line reference voltage line is configured to receive the first signal-line reference voltage supplied from the reference voltage supply circuit; the resistor includes a first sub-resistor, a first terminal of the first sub-resistor is connected to the first signal-line reference voltage line, and a second terminal of the first sub-resistor is connected to the second signal-line reference voltage line; or, the second signal-line reference voltage line is configured to receive the second signal-line reference voltage supplied from the reference voltage supply circuit; the resistor includes a second sub-resistor, a first terminal of the second sub-resistor is connected to the first signal-line reference voltage line, and a second terminal of the second sub-resistor is connected to the second signal-line reference voltage line.

In the implementation, the resistance value of the first sub-resistor is larger than the resistance value of the first signal-line reference voltage line.

In a case that the reference voltage circuit includes one first signal-line reference voltage line and one second signal-line reference voltage line, the resistance circuit may include only one resistor, the resistor may include one sub-resistor arranged between the first signal-line reference voltage line and the second signal-line reference voltage line.

In a second specific implementation, N equals to 1 and M equals to 2; the first signal-line reference voltage line is configured to receive the first signal-line reference voltage supplied from the reference voltage supply circuit, and the resistance circuit includes a first resistor and a second resistor; the first resistor includes a first first sub-resistor, and the second resistor includes a second first sub-resistor; a first terminal of the first first sub-resistor is connected to the first signal-line reference voltage line, and a second terminal of the first first sub-resistor is connected to a first one of the two second signal-line reference voltage lines; a first terminal of the second first sub-resistor is connected to the first signal-line reference voltage line, and a second terminal of the second first sub-resistor is connected to a second one of the two second signal-line reference voltage lines.

In a case that the reference voltage circuit includes one first signal-line reference voltage line and two second signal-line reference voltage lines in some embodiments of the present disclosure, the reference voltage supply circuit may supply the first signal-line reference voltage line with the first signal-line reference voltage, and the resistance circuit may include two resistors, each of the two resistors may include one first sub-resistor.

In an actual implementation, the resistance value of the first first sub-resistor is larger than the resistance value of the first signal-line reference voltage line; and the resistance value of the second first sub-resistor is larger than the resistance value of the first signal-line reference voltage line.

In an actual implementation, the resistance value of the first first sub-resistor may be almost equal to the resistance value of the second first sub-resistor, so that the second signal-line reference voltage suppled to the first second signal-line reference voltage line is approximately equal to the second signal-line reference voltage supplied to the second second signal-line reference voltage line.

In a third specific implementation, N equals 1 and M equals to 2; two second signal-line reference voltage lines are configured to receive second signal-line reference voltages supplied from the reference voltage supply circuit, and the resistance circuit includes one resistor, and the resistor includes a second sub-resistor.

A first terminal of the second sub-resistor is connected to the first signal-line reference voltage line, and a second terminal of the second sub-resistor is connected to one of the two second signal-line reference voltage lines.

In an actual implementation, the resistance value of the second sub-resistor is larger than the resistance value of the one of the two second signal-line reference voltage lines.

In a case that the reference voltage circuit includes one first signal-line reference voltage line and two second signal-line reference voltage lines in some embodiments of the present disclosure, the reference voltage supply circuit may supply the two second signal-line reference voltage lines with second signal-line reference voltages, respectively, and the resistance circuit may include one resistor; the resistor may include one second sub-resistor. The second sub-resistor is arranged between the first signal-line reference voltage line and one of the second signal-line reference voltage line, so that the second signal-line reference voltage on the second signal-line reference voltage line may be reduced through the second sub-resistor to obtain the first signal-line reference voltage and the first signal-line reference voltage is transferred to the first signal-line reference voltage line.

In a fourth specific implementation, N equals 1 and M equals to 2; two second signal-line reference voltage lines are configured to receive second signal-line reference voltages supplied from the reference voltage supply circuit, and the resistance circuit includes one resistor, and the resistor includes a first second sub-resistor and a second second sub-resistor; a first terminal of the first second sub-resistor is connected to the first signal-line reference voltage line, and a second terminal of the first second sub-resistor is connected to a first one of the two second signal-line reference voltage lines; a first terminal of the second second sub-resistor is connected to the first signal-line reference voltage line, and a second terminal of the second second sub-resistor is connected to a second one of the two second signal-line reference voltage lines.

In an actual implementation, the resistance value of the first second sub-resistor and the resistance value of the second second sub-resistor are larger than the resistance values of the two second signal-line reference voltage lines.

In a case that the reference voltage supply circuit includes one first signal-line reference voltage line and two second signal-line reference voltage lines in some embodiments of the present disclosure, the reference voltage supply circuit may supply the two second signal-line reference voltage lines with the second signal-line reference voltages, respectively, and the resistance circuit may include one resistor; the resistor may include two second sub-resistors. A first one of the second sub-resistors is arranged between the first signal-line reference voltage line and a first one of the second signal-line reference voltage lines, so that the second signal-line reference voltage on the first one of the second signal-line reference voltage lines may be reduced through the first second sub-resistor to obtain a first first signal-line reference voltage and the first first signal-line reference voltage is transferred to the first signal-line reference voltage line. A second one of the second sub-resistors is arranged between the first signal-line reference line and a second one of the second signal-line reference voltage lines, so that the second signal-line reference voltage on the second second signal-line reference voltage line may be reduced through the second second sub-resistor to obtain a second first signal-line reference voltage, and the second first signal-line reference voltage is transferred to the first signal-line reference voltage line.

In an actual implementation, the resistance value of the first second sub-resistor may be almost equal to the resistance value of the second second sub-resistor, so that the first first signal-line reference voltage is approximately equal to the second first signal-line reference voltage.

In a fifth specific implementation, N equals to 2 and M equals to 1; two first signal-line reference voltage lines are configured to receive first signal-line reference voltages supplied from the reference voltage supply circuit, and the resistance circuit includes one resistor, and the resistor includes a first sub-resistor; a first terminal of the first sub-resistor is connected to a first one of the first signal-line reference voltage lines, and a second terminal of the first sub-resistor is connected to the second signal-line reference voltage line.

In the implementation, the resistance value of the first sub-resistor is larger than the resistance values of the first signal-line reference voltage lines.

When the reference voltage circuit includes the first first signal-line reference voltage line, the second first signal-line reference voltage line, and the second signal-line reference voltage line in some embodiments of the present disclosure, the reference voltage supply circuit may supply the first first signal-line reference voltage line and the second first signal-line reference voltage line with first signal-line reference voltages, respectively, and the resistance circuit may include a resistor; the resistor may include a first sub-resistor. The first sub-resistor is arranged between the second signal-line reference voltage line and one of the first signal-line reference voltage lines, so that the first signal-line reference voltage on the first signal-line reference voltage line may be reduced through the first sub-resistor to obtain the second signal-line reference voltage and the second signal-line reference voltage is transferred to the second signal-line reference voltage line.

In a sixth specific implementation, N equals to 2 and M equals to 1; two first signal-line reference voltage lines are configured to receive first signal-line reference voltages supplied from the reference voltage supply circuit; the resistance circuit includes a resistor. The resistor includes a first first sub-resistor and a second first sub-resistor. A first terminal of the first first sub-resistor is connected to a first one of the first signal-line reference voltage lines, and a second terminal of the first first sub-resistor is connected to the second signal-line reference voltage line; a first terminal of the second first sub-resistor is connected to a second one of the first signal-line reference voltage lines, and a second terminal of the second first sub-resistor is connected to the second signal-line reference voltage line.

In the implementation, the resistance value of the first first sub-resistor and the resistance value of the second first sub-resistor are larger than the resistance values of the two first signal-line reference voltage lines.

When the reference voltage circuit includes the first first signal-line reference voltage line, the second first signal-line reference voltage line, and the second signal-line reference voltage line in some embodiments of the present disclosure, the reference voltage supply circuit may supply the first first signal-line reference voltage line and the second first signal-line reference voltage line with the first signal-line reference voltages, respectively, and the resistance circuit may include one resistor; the resistor may include a first first sub-resistor and a second first sub-resistor. The first first sub-resistor is arranged between the first first signal-line reference voltage line and the second signal-line reference voltage line, so that the first signal-line reference voltage on the first first signal-line reference voltage line may be reduced through the first first sub-resistor to obtain a first second signal-line reference voltage and the first second signal-line reference voltage is transferred to the second signal-line reference voltage line. The second first sub-resistor is arranged between the second first signal-line reference line and the second signal-line reference voltage line, so that the first signal-line reference voltage on the second first signal-line reference voltage line may be reduced through the second first sub-resistor to obtain a second second signal-line reference voltage, and the second second signal-line reference voltage is transferred to the second signal-line reference voltage line.

In the implementation, the resistance value of the first first sub-resistor may be almost equal to the resistance value of the second first sub-resistor, so that a value of the first second signal-line reference voltage is approximately equal to that of the second second signal-line reference voltage.

In a seventh specific implementation, N equals to 2 and M equals to 1; the second signal-line reference voltage line is configured to receive the second signal-line reference voltage supplied from the reference voltage supply circuit; the resistance circuit includes a first resistor and a second resistor; the first resistor includes a first second sub-resistor, and the second resistor includes a second second sub-resistor; a first terminal of the first second sub-resistor is connected to a first one of the first signal-line reference voltage lines, and a second terminal of the first second sub-resistor is connected to the second signal-line reference voltage line; a first terminal of the second second sub-resistor is connected to a second one of the first signal-line reference voltage lines, and a second terminal of the second second sub-resistor is connected to the second signal-line reference voltage line.

In the implementation, the resistance value of the first second sub-resistor and the resistance value of the second second sub-resistor are larger than the resistance value of the second signal-line reference voltage line.

When the reference voltage circuit includes the first first signal-line reference voltage line, the second first signal-line reference voltage line, and the second signal-line reference voltage line in some embodiments of the present disclosure, the reference voltage supply circuit may supply the second signal-line reference voltage line with the second signal-line reference voltage, and the resistance circuit may include a first resistor and a second resistor; the first resistor may include a first second sub-resistor. The first second sub-resistor is arranged between the first first signal-line reference voltage line and the second signal-line reference voltage lines. The second signal-line reference voltage on the second signal-line reference voltage line may be reduced through the first second sub-resistor to obtain a first first signal-line reference voltage. The second resistor includes a second second sub-resistor. The second second sub-resistor is arranged between the second first signal-line reference voltage line and the second signal-line reference voltage line. The second signal-line reference voltage on the second signal-line reference voltage line is reduced through the second second sub-resistor to obtain a second first signal-line reference voltage.

In the implementation, the resistance value of the first second sub-resistor may be almost equal to the resistance value of the second second sub-resistor, so that the first first signal-line reference voltage is approximately equal to the second first signal-line reference voltage.

In an eighth specific implementation, N equals to 2 and M equals to 2; two first signal-line reference voltage lines are configured to receive first signal-line reference voltages supplied from the reference voltage supply circuit, respectively. The resistance circuit includes a first resistor and a second resistor. The first resistor includes a first first sub-resistor and a second first sub-resistor, and the second resistor includes a third first sub-resistor and a fourth first sub-resistor. A first terminal of the first first sub-resistor is connected to a first one of the first signal-line reference voltage lines, and a second terminal of the first first sub-resistor is connected to a first one of second signal-line reference voltage lines. A first terminal of the second first sub-resistor is connected to the first one of the first signal-line reference voltage lines, and a second terminal of the second first sub-resistor is connected to a second one of the second signal-line reference voltage lines. A first terminal of the third first sub-resistor is connected to a second one of the first signal-line reference voltage lines, and a second terminal of the third first sub-resistor is connected to the first one of the second signal-line reference voltage lines. A first terminal of the fourth first sub-resistor is connected to the second one of the first signal-line reference voltage lines, and a second terminal of the fourth first sub-resistor is connected to the second one of the second signal-line reference voltage lines.

In the implementation, the resistance values of the first first sub-resistor, the second first sub-resistor, the third first sub-resistor, and the fourth first resistor are larger than the resistance values of the first signal-line reference voltage lines.

When the reference voltage circuit includes the first first signal-line reference voltage line, the second first signal-line reference voltage line, the first second signal-line reference voltage line and the second second signal-line reference voltage line in some embodiments of the present disclosure, the reference voltage supply circuit may supply the first first signal-line reference voltage line and the second first signal-line reference voltage line with the first signal-line reference voltages, respectively, and the resistance circuit may include the first resistor and the second resistor; the first resistor may include the first first sub-resistor and the second first sub-resistor; the first first sub-resistor is arranged between the first first signal-line reference voltage line and the first second signal-line reference voltage line, so that the first signal-line reference voltage on the first first signal-line reference voltage line may be reduced through the first first sub-resistor to obtain a first second signal-line reference voltage and the first second signal-line reference voltage is transferred to the first second signal-line reference voltage line. The second first sub-resistor is arranged between the first first signal-line reference line and the second second signal-line reference voltage line, so that the first signal-line reference voltage on the first first signal-line reference voltage line may be reduced through the second first sub-resistor to obtain a second second signal-line reference voltage, and the second second signal-line reference voltage is transferred to the second second signal-line reference voltage line. The second resistor includes the third first sub-resistor and the fourth first sub-resistor. The third first sub-resistor is arranged between the second first signal-line reference voltage line and the first second signal-line reference voltage line, so that the first signal-line reference voltage on the second first signal-line reference line may be reduced through the third first sub-resistor to obtain a third second signal-line reference voltage, and the third second signal-line reference voltage is transferred to the first second signal-line reference voltage line. The fourth first sub-resistor is arranged between the second first signal-line reference voltage line and the second second signal-line reference voltage line, so that the first signal-line reference voltage on the second first signal-line reference voltage line may be reduced through the fourth first sub-resistor to obtain a fourth second signal-line reference voltage, and the fourth second signal-line reference voltage is transferred to the second second signal-line reference voltage line.

Optionally, the first signal-line reference voltages supplied from the reference voltage supply circuit and received by the two first signal-line reference voltage lines are equal, and the second signal-line reference voltages transferred to the two second signal-line reference voltage lines are approximately the same.

In a ninth specific implementation, N equals 2 and M equals to 2. Two second signal-line reference voltage lines are configured to receive second signal-line reference voltages supplied from the reference voltage supply circuit, respectively. The resistance circuit includes a first resistor and a second resistor. The first resistor includes a first second sub-resistor and a second second sub-resistor. The second resistor includes a third second sub-resistor and a fourth second sub-resistor. A first terminal of the first second sub-resistor is connected to a first one of the first signal-line reference voltage lines, and a second terminal of the first second sub-resistor is connected to a first one of the second signal-line reference voltage lines. A first terminal of the second second sub-resistor is connected to the first one of the first signal-line reference voltage lines, and a second terminal of the second second sub-resistor is connected to a second one of the second signal-line reference voltage lines. A first terminal of the third second sub-resistor is connected to a second one of the first signal-line reference voltage lines, and a second terminal of the third second sub-resistor is connected to the first one of the second signal-line reference voltage lines. A first terminal of the fourth second sub-resistor is connected to the second one of the first signal-line reference voltage lines, and a second terminal of the fourth second sub-resistor is connected to the second one of the second signal-line reference voltage lines.

In the implementation, the resistance values of the first second sub-resistor, the second second sub-resistor, the third second sub-resistor, and the four second resistor are larger than the resistance values of the second signal-line reference voltage lines.

When the reference voltage circuit includes the first first signal-line reference voltage line, the second first signal-line reference voltage line, the first second signal-line reference voltage line and the second second signal-line reference voltage line in some embodiments of the present disclosure, the reference voltage supply circuit may supply the first second signal-line reference voltage line and the second second signal-line reference voltage line with the second signal-line reference voltages, respectively, and the resistance circuit may include the first resistor and the second resistor; the first resistor may include the first second sub-resistor and the second second sub-resistor; the first second sub-resistor is arranged between the first first signal-line reference voltage line and the first second signal-line reference voltage line, so that the second signal-line reference voltage on the first second signal-line reference voltage line may be reduced through the first second sub-resistor to obtain a first first signal-line reference voltage and the first first signal-line reference voltage is transferred to the first first signal-line reference voltage line; the second second sub-resistor is arranged between the first first signal-line reference line and the second second signal-line reference voltage line, so that the second signal-line reference voltage on the second second signal-line reference voltage line may be reduced through the second second sub-resistor to obtain a second first signal-line reference voltage, and the second first signal-line reference voltage is transferred to the first first signal-line reference voltage line; the second resistor includes the third second sub-resistor and the fourth second sub-resistor; the third second sub-resistor is arranged between the second first signal-line reference voltage line and the first second signal-line reference voltage line, so that the second signal-line reference voltage on the first second signal-line reference line may be reduced through the third second sub-resistor to obtain a third first signal-line reference voltage, and the third first signal-line reference voltage is transferred to the second first signal-line reference voltage line; the fourth second sub-resistor is arranged between the second first signal-line reference voltage line and the second second signal-line reference voltage line, so that the second signal-line reference voltage on the second second signal-line reference voltage line may be reduced through the fourth second sub-resistor to obtain a fourth first signal-line reference voltage, and the fourth first signal-line reference voltage is transferred to the second first signal-line reference voltage line.

Optionally, the second signal-line reference voltages supplied from the reference voltage supply circuit and received by the second signal-line reference voltage lines are equal, and the first signal-line reference voltages transferred to the first signal-line reference voltage lines are approximately the same.

In actual applications, each of the first signal-line reference voltage lines may be a data-line reference voltage line, and first signal-line electro-static discharge circuits are data-line electro-static discharge circuits (data-line ESD circuits), and the data-line reference voltage line is configured to supply a data-line reference voltage to the data-line electrostatic discharge circuits. Each of the data-line ESD circuits may be connected to a data line and the data-line reference voltage line and configured to perform an electro-static protection operation to the data line. Each of the data-line ESD circuits may include a first control transistor and a first capacitor, but a specific structure of the data-line ESD circuit is not limited thereto, the following description of the data-line ESD circuit is given through this structure. A first terminal of the first capacitor is connected to the data line, and a second terminal of the first capacitor is connected to a gate electrode of the first control transistor, and a first electrode of the first control transistor is connected to the data line, and a second electrode of the first control transistor is connected to the data-line reference voltage line. In actual applications, the data-line ESD circuit may be located at a upper side of a display panel or a lower side of the display panel, or both at the upper side and at the lower side of the display panel (in such a case, some of the data-line ESD circuits arranged at the upper side of the display panel are connected to upper ends of data lines, and others of the data-line ESD circuits arranged at the lower side of the display panel are connected to lower ends of the data lines). Accordingly, the data-line reference voltage lines may be located at the upper side of the display panel, or at the lower side of the display panel, or both at the upper side of the display panel and at the lower side of the display panel. The data-line reference voltage lines may be arranged to extend horizontally.

In actual applications, each of the second signal-line reference voltage lines may be a gate-line reference voltage line, and second signal-line electro-static discharge circuits are gate-line electro-static discharge circuits (gate-line ESD circuits), and the gate-line reference voltage line is configured to supply a gate-line reference voltage to the gate-line electro-static discharge circuits. Each of the gate-line ESD circuits may be connected to a gate line and the gate-line reference voltage line and configured to perform an electrostatic protection operation to the gate line. The gate-line ESD circuit may include a second control transistor and a second capacitor, a specific structure of the gate-line ESD circuit is not limited thereto, the following description of the gate-line ESD is given through this structure). A first terminal of the second capacitor is connected to the gate line, and a second terminal of the second capacitor is connected to a gate electrode of the second control transistor, and a second electrode of the second control transistor is connected to the gate line, and a second electrode of the second control transistor is connected to the gate-line reference voltage line. In actual applications, the gate-line ESD circuits may be located at a left side of the display panel or a right side of the display panel, or both at the left side and at the right side of the display panel (in such a case, some of the gate-line ESD circuits arranged at the left side of the display panel are connected to left ends of gate lines, and others of the gate-line ESD circuits arranged at the left side of the display panel are connected to right ends of the gate lines). Accordingly, the gate-line reference voltage lines may be located at the left side of the display panel, or at the right side of the display panel, or both at the left side of the display panel and at the right side of the display panel. The gate-line reference voltage lines may be arranged to extend vertically.

In actual applications, the reference voltage supply circuit may supply data-line reference voltages Vrefd to the N data-line reference voltage lines, respectively; and the data-line reference voltages Vrefd are reduced through the first sub-resistors of the resistor included in the resistance circuit so as to obtain gate-line reference voltages Vrefg to be transferred to the gate-line reference voltage lines, wherein Vrefg is smaller than Vrefd, and the resistance values of the first sub-resistors are relatively large. The resistance values of the data-line reference voltage lines and the resistance values of the gate-line reference voltage lines are relatively small, so that the data-line reference voltages supplied to the data-line ESD circuits are approximately the same, and the gate-line reference voltages supplied to the gate-line ESD circuits are approximately the same.

In actual applications, the reference voltage supply circuit may also supply gate-line reference voltages Vrefg to the M gate-line reference voltage lines, respectively; and the gate-line reference voltages Vrefg are reduced through the second sub-resistors of the resistor included in the resistance circuit so as to obtain data-line reference voltages Vrefd to be transferred to the data-line reference voltage lines, wherein Vrefd is smaller than Vrefg, and the resistance values of the second sub-resistors are relatively large, and the resistance values of the gate-line reference voltage lines and the resistance values of the data-line reference voltage lines are relatively small, so that the data-line reference voltages supplied to the data-line ESD circuits are approximately the same, and the gate-line reference voltages supplied to the gate-line ESD circuits are approximately the same.

The reference voltage circuit of the present disclosure will be described hereinafter by means of a specific example.

Figure 1:
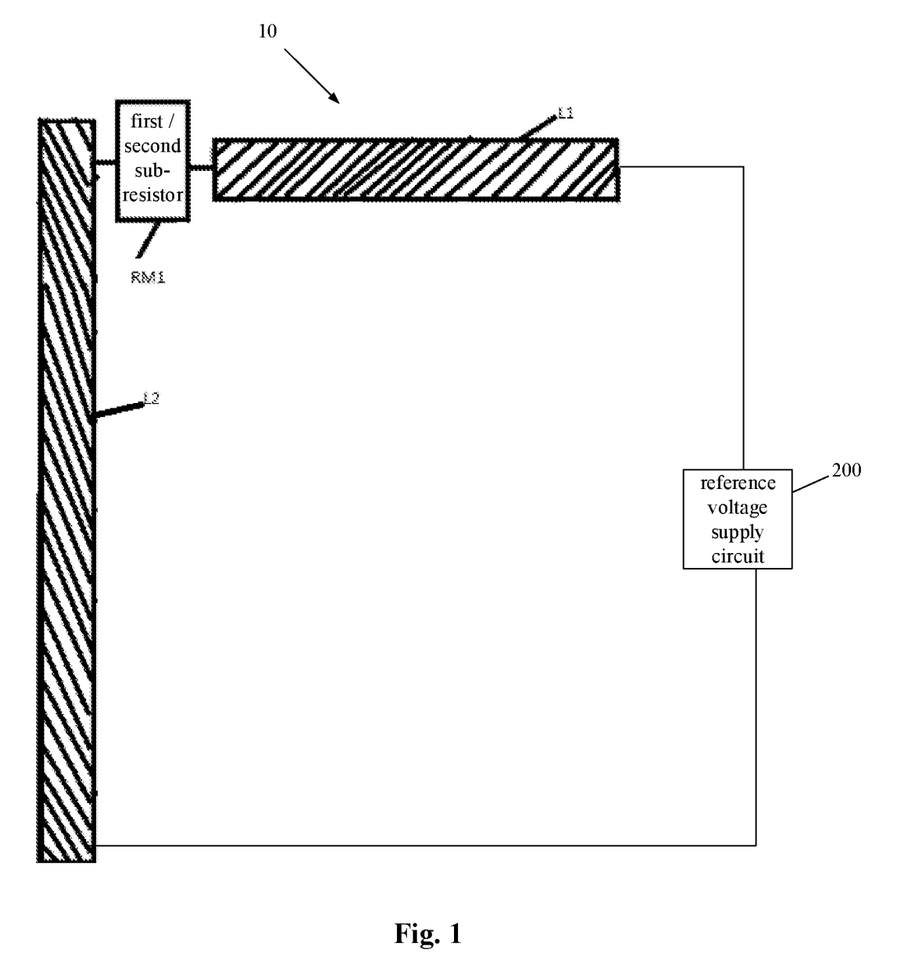
FIG. 1 is a structural diagram of a reference voltage circuit provided in some embodiments of the present disclosure.
Figure 2:
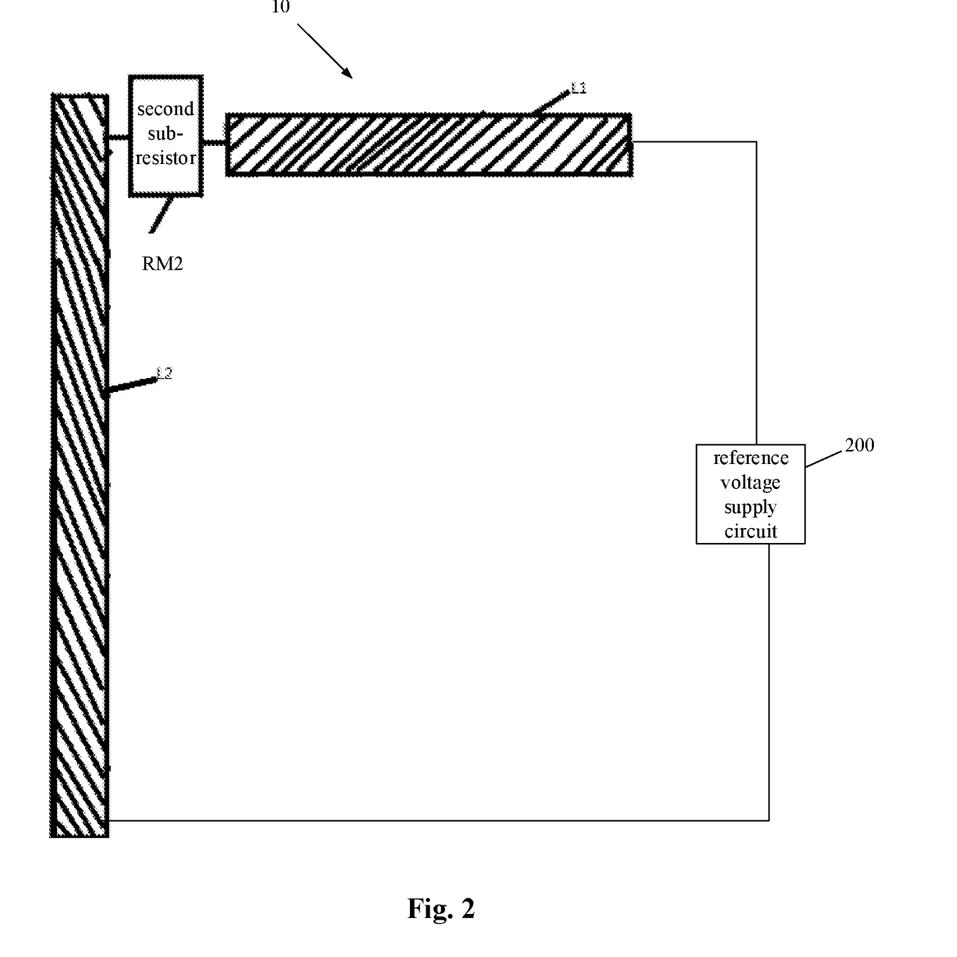
FIG. 2 is a structural diagram of a reference voltage circuit provided in some embodiments of the present disclosure.

As shown in FIG. 1 an FIG. 2, the reference voltage circuit 100 provided in the present disclosure includes a first signal-line reference voltage line L1, a second signal-line reference voltage line L2, and a resistance circuit.

The first signal-line reference voltage line is configured to receive a first signal-line reference voltage supplied from a reference voltage supply circuit 200; the resistance circuit includes a resistor, and the resistor includes a first sub-resistor RM1, a first terminal of the first sub-resistor RM1 is connected to the first signal-line reference voltage line L1, and a second terminal of the first sub-resistor RM1 is connected to the second signal-line reference voltage line L2; wherein the resistance value of the first sub-resistor RM1 is larger than the resistance value of the first signal-line reference voltage line L1.

Optionally, the second signal-line reference voltage line is configured to receive a second signal-line reference voltage supplied from a reference voltage supply circuit 200; the resistance circuit includes a resistor, and the resistor includes a second sub-resistor RM2, a first terminal of the second sub-resistor RM2 is connected to the first signal-line reference voltage line L1, and a second terminal of the second sub-resistor RM2 is connected to the second signal-line reference voltage line L2; wherein the resistance value of the second sub-resistor RM2 is larger than the resistance value of the second signal-line reference voltage line L2.

The above is described by way of an example that the reference voltage circuit includes one first signal-line reference voltage line L1 and one second signal-line reference voltage line L2. In actual applications, a quantity of the first signal-line reference voltage lines may be larger than or equal to 1, and a quantity of the second signal-line reference voltage lines may larger than or equal to 1.

The reference voltage supply circuit 200 in the present disclosure may be any circuit capable of providing the first signal-line reference voltages and the second signal-line reference voltages to the first signal-line reference voltage lines L1 and the second signal-line reference voltage lines L2, respectively.

The reference voltage supply main circuit provided in some embodiments of the present disclosure is applied in a display device, and includes a reference voltage supply circuit 20 and the above reference voltage circuit 100.

The reference voltage supply circuit 200 is connected to the N first signal-line reference voltage lines and configured to supply the first signal-line reference voltages to the N first signal-line reference voltage lines, respectively; or the reference voltage supply circuit 200 is connected to the M second signal-line reference voltage lines and configured to supply the second signal-line reference voltages to the M second signal-line reference voltage lines, respectively.

The reference voltage supply main circuit in some embodiments of the present disclosure includes the above reference voltage circuit and the reference voltage supply circuit. The resistance circuit is included in the reference voltage circuit, and includes sub-resistors arranged between the first signal-line reference voltage lines and the second signal-line reference voltage lines and having relatively larger resistance values. Thus, after the first signal-line reference voltage lines are supplied with electrical voltages, the second signal-line reference voltage lines may obtain reference voltages; and/or, after the second signal-line reference voltage lines are supplied with electrical voltages, the first signal-line reference voltage lines may obtain reference voltages. Since the resistance value of each of the first signal-line reference voltage lines or the second signal-line reference voltage lines is designed to be small, a voltage drop of each of the first signal-line reference voltage lines or the second signal-line reference voltage lines is not significant, and the protection effect of Electro-Static Discharge (ESD) is more reliable.

In actual applications, the first signal-line reference voltage lines may be the data-line reference voltage lines, and the second signal-line reference voltage lines may be the gate-line reference voltage lines.

The reference voltage supply main circuit is described hereinafter by way of a case in which N equals to 2, M equals to 2, the first signal-line reference voltages lines are the data-line reference voltage lines, and the second signal-line reference voltage lines are the gate-line reference voltage lines, and the reference voltage supply circuit supplies the data-line reference voltages to the two data-line reference voltage lines.

Figure 3:
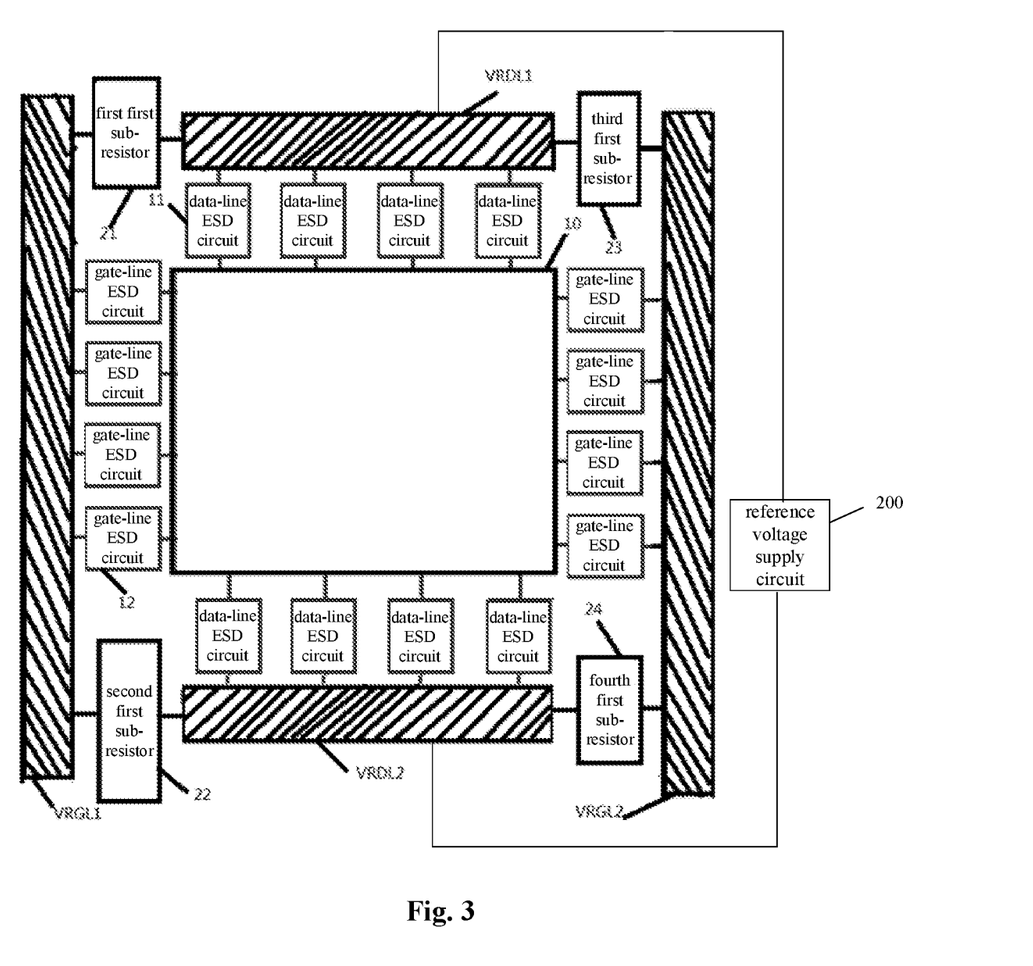
FIG. 3 is a structural diagram of a first example of a reference voltage supply main circuit provided in some embodiments of the present disclosure.

As shown in FIG. 3, a first specific example of the reference voltage supply main circuit in the present disclosure includes a first data-line reference voltage line VRDL1, a second data-line reference voltage line VRDL2, a first gate-line reference voltage line VRGL1, and a second gate-line reference voltage line VGL2. The first data-line reference voltage line VRDL1 and the second data-line reference voltage line VRDL2 provide data-line reference voltages, and the first gate-line reference voltage line VRGL1 and the second gate-line reference voltage line VRGL2 provide gate-line reference voltages. The reference voltage supply main circuit further includes a reference voltage supply circuit 200 and a resistance circuit.

The reference voltage supply circuit 200 is configured to supply the data-line reference voltages to the first data-line reference voltage line VRDL1 and the second data-line reference voltage line VRDL2, respectively, and the resistance circuit includes a first resistor and a second resistor. The first resistor includes a first first sub-resistor 21 and a second first sub-resistor 22. A first terminal of the first first sub-resistor 21 is connected to the first data-line reference voltage line VRDL1, and a second terminal of the first first sub-resistor 21 is connected to the first gate-line reference voltage line VRGL1. A first terminal of the second first sub-resistor 22 is connected to the second data-line reference voltage line VRDL2, and a second terminal of the second first sub-resistor 22 is connected to the first gate-line reference voltage line VRGL1. The second resistor includes a third first sub-resistor 23 and a fourth first sub-resistor 24. A first terminal of the third first sub-resistor 23 is connected to the first data-line reference voltage line VRDL1, and a second terminal of the third first sub-resistor 23 is connected to the second gate-line reference voltage line VRGL2. A first terminal of the fourth first sub-resistor 24 is connected to the second data-line reference voltage line VRDL2, and a second terminal of the fourth first sub-resistor 24 is connected to the second gate-line reference voltage line VRGL2.

Resistance values of the first first sub-resistor 21, the second first sub-resistor 22, the third first sub-resistor 23, and the fourth first resistor 24 are larger than a resistance value of the first data-line reference voltage line VRDL1. The resistance values of the first first sub-resistor 21, the second first sub-resistor 22, the third first sub-resistor 23, and the fourth first resistor 24 are larger than a resistance value of the second data-line reference voltage line VRDL2.

In FIG. 3, a region marked by a reference sign 10 is an active display area of a display pane, and a region marked by a reference sign 11 is a data-line ESD circuit, and a region marked by a reference sign 12 is a gate-line ESD circuit. In FIG. 3, eight data-line ESD circuits and eight gate-line ESD circuits are exemplarily shown. In actual applications, a quantity of the data-line ESD circuits may be more than eight and correspond to a quantity of data lines; and a quantity of the gate-line ESD circuits may be more than eight and correspond to a quantity of gate lines.

In the present disclosure, the resistance values of the data-line reference voltage lines extending in a horizontal direction and the resistance values of the gate-line reference voltage lines extending in a vertical direction are relatively small, so that values of the data-line reference voltages supplied to the data-line ESD circuits are approximately the same, and values of the gate-line reference voltages supplied to the gate-line ESD are approximately the same, and thus the protection effect of the ESD is more reliable.

In actual applications, the first sub-resistor may include a conductive wire, and a resistance value of the conductive wire may be set by configuring a length and a cross-sectional area of the conductive area. As mentioned above, the conductive wire may exhibit many forms, such as the conductive zigzag line, the conductive fret line, a conductive coil, or the like.

Optionally, the first sub-resistor includes the conductive zigzag line. The conductive zigzag line may save a footprint of the first sub-resistor, and a large resistance value may be achieved in a limited region.

The reference voltage supply main circuit is described hereinafter by way of a case in which N equals to 2, M equals to 2, the first signal-line reference voltages lines are the data-line reference voltage lines, and the second signal-line reference voltage lines are the gate-line reference voltage lines, and the reference voltage supply circuit supplies the gate-line reference voltages to the two gate-line reference voltage lines.

Figure 4:
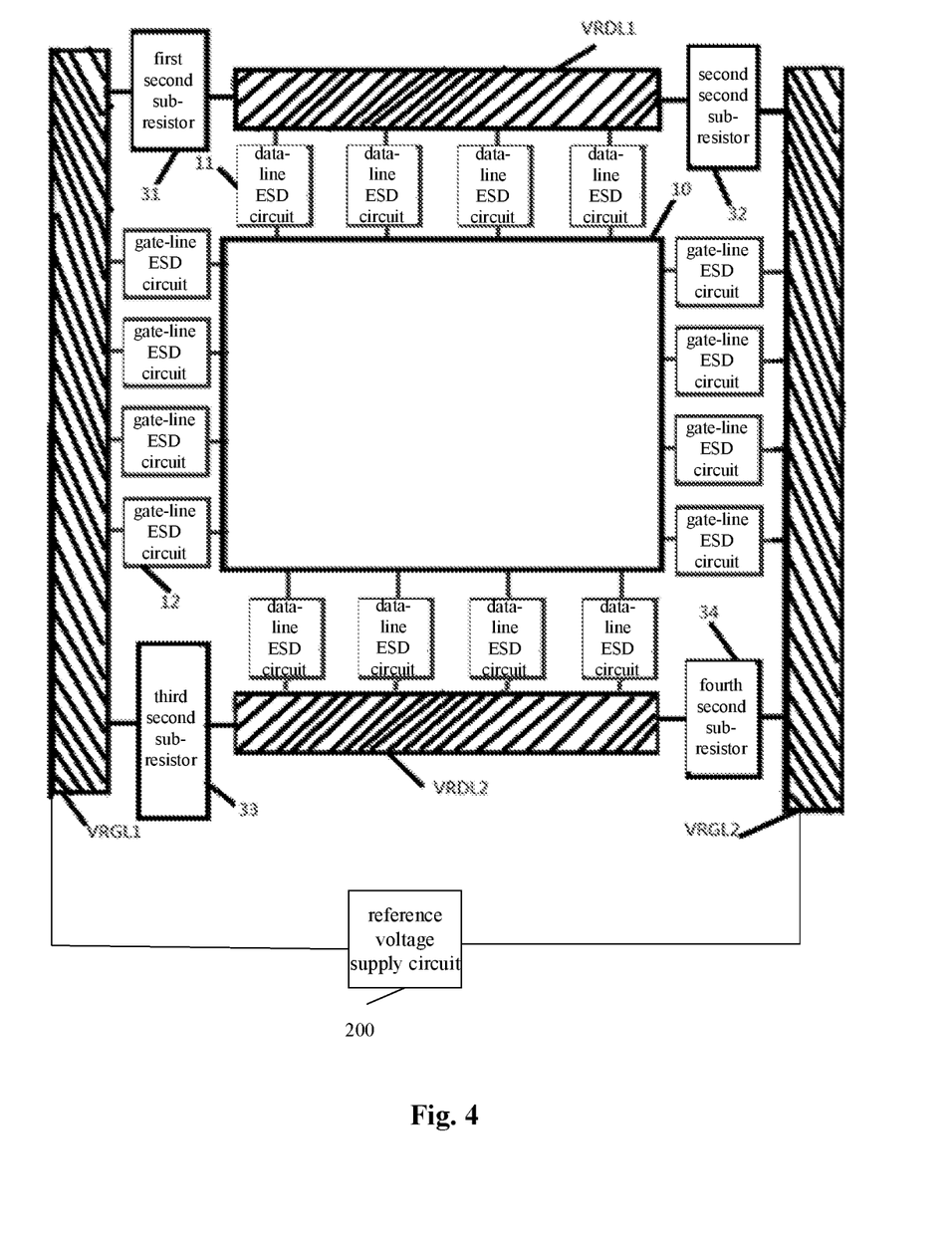
FIG. 4 is a structural diagram of a second example of a reference voltage supply main circuit provided in some embodiments of the present disclosure.

As shown in FIG. 4, a second specific example of the reference voltage supply main circuit in the present disclosure includes the first data-line reference voltage line VRDL1, the second data-line reference voltage line VRDL2, the first gate-line reference voltage line VRGL1, and the second gate-line reference voltage line VRGL2. The first gate-line reference voltage line VRGL1 and the second gate-line reference voltage line VRGL2 provide gate-line reference voltages. The reference voltage supply main circuit further includes the reference voltage supply circuit 200 and the resistance circuit.

The reference voltage supply circuit 200 is configured to supply gate-line reference voltages to the first gate-line reference voltage line VRGL1 and the second gate-line reference voltage line VRGL2, respectively. The resistance circuit includes a first resistor and a second resistor. The first resistor includes a first second sub-resistor 31 and a second second sub-resistor 32. A first terminal of the first second sub-resistor 31 is connected to the first data-line reference voltage line VRDL1, and a second terminal of the first second sub-resistor 31 is connected to the first gate-line reference voltage line VRGL1. A first terminal of the second second sub-resistor 32 is connected to the first data-line reference voltage line VRDL1, and a second terminal of the second second sub-resistor 32 is connected to the second gate-line reference voltage line VRGL2.

The second resistor includes a third second sub-resistor 33 and a fourth second sub-resistor 34. A first terminal of the third second sub-resistor 33 is connected to the second data-line reference voltage line VRDL2, and a second terminal of the third second sub-resistor 33 is connected to the first gate-line reference voltage line VRGL1. A first terminal of the fourth second sub-resistor 34 is connected to the second data-line reference voltage line VRDL2, and a second terminal of the fourth second sub-resistor 34 is connected to the second gate-line reference voltage line VRGL2.

Resistance values of the first second sub-resistor 31, the second second sub-resistor 32, the third second sub-resistor 33, and the fourth second resistor 34 are larger than a resistance value of the first gate-line reference voltage line VRGL1.

Resistance values of the first second sub-resistor 31, the second second sub-resistor 32, the third second sub-resistor 33, and the fourth second resistor 34 are larger than a resistance value of the second gate-line reference voltage line VRGL2.

In FIG. 4, a region marked by a reference sign 10 is the active display area of the display pane, and a region marked by a reference sign 11 is the data-line ESD circuit, and a region marked by a reference sign 12 is the gate-line ESD circuit. In FIG. 4, eight data-line ESD circuits and eight gate-line ESD circuits are exemplarily shown. In actual applications, a quantity of the data-line ESD circuits may be more than eight and correspond to a quantity of data lines; and a quantity of the gate-line ESD circuits may be more than eight and correspond to a quantity of gate lines.

In the present disclosure, resistance values of the data-line reference voltage lines extending in a horizontal direction and resistance values of the gate-line reference voltage lines extending in a vertical direction are relatively small, so that values of the data-line reference voltages supplied to the data-line ESD circuits are approximately the same, and values of the gate-line reference voltages supplied to the gate-line ESD circuits are approximately the same, and thus the protection effect of the ESD is more reliable.

In actual applications, the second sub-resistor may include a conductive wire, and a resistance value of the conductive wire may be set by configuring a length and a cross-sectional area of the conductive wire. As mentioned above, the conductive wire may exhibit many forms, such as the conductive zigzag line, the conductive fret line, a conductive coil, or the like.

Optionally, the second sub-resistor includes a conductive zigzag line. The conductive zigzag line may save a footprint of the second sub-resistor, and a large resistance value may be achieved in a limited region.

Figure 5:
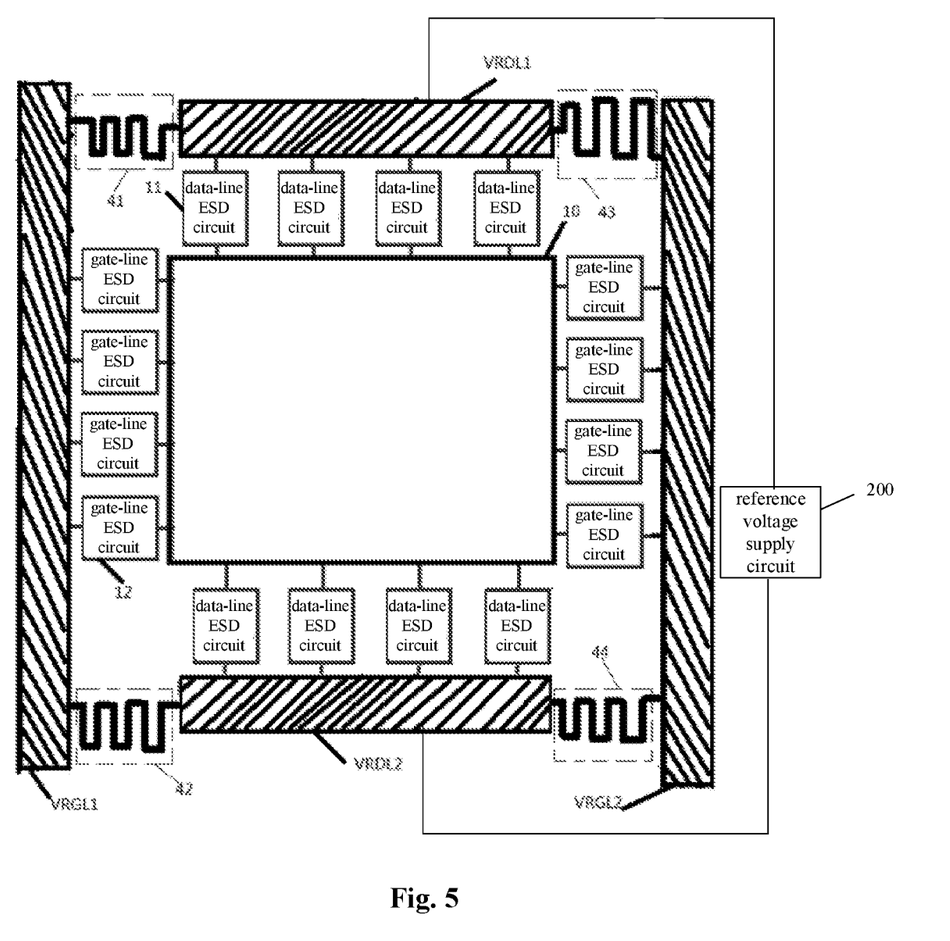
FIG. 5 is a structural diagram of a third example of a reference voltage supply main circuit provided in some embodiments of the present disclosure.

As shown in FIG. 5, a third specific example of the reference voltage supply main circuit in the present disclosure includes the first data-line reference voltage line VRDL1, the second data-line reference voltage line VRDL2, the first gate-line reference voltage line VRGL1, and the second gate-line reference voltage line VRGL2. The example of the reference voltage supply main circuit further includes the reference voltage supply circuit 200 and a resistance circuit.

The first data-line reference voltage line VRDL1 may be arranged at the upper side of the display panel, and the second data-line reference voltage line VRDL2 may be arranged at the lower side of the display panel. The first gate-line reference voltage line VRGL1 may be arranged at the left side of the display panel, and the second gate-line reference voltage line VRGL2 may be arranged at the right side of the display panel.

The reference voltage supply circuit 200 is connected to the first data-line reference voltage line VRDL1 and the second data-line reference voltage line VRDL2. The resistance circuit includes a first resistor and a second resistor.

The first resistor includes a first conductive wire 41 and a second conductive wire 42. A first terminal of the first conductive wire 41 is connected to a left end of the first data-line reference voltage line VRDL1, and a second terminal of the first conductive wire 41 is connected to the first gate-line reference voltage line VRGL1. A first terminal of the second conductive wire 42 is connected to a left end of the second data-line reference voltage line VRDL2, and a second terminal of the second conductive wire 42 is connected to the first gate-line reference voltage line VRGL1.

The second resistor includes a third conductive wire 43 and a fourth conductive wire 44. A first terminal of the third conductive wire 43 is connected to a right end of the first data-line reference voltage line VRDL1, and a second terminal of the third conductive wire 43 is connected to the second gate-line reference voltage line VRGL2. A first terminal of the fourth conductive wire 44 is connected to a right end of the second data-line reference voltage line VRDL2, and a second terminal of the fourth conductive wire 44 is connected to the second gate-line reference voltage line VRGL2.

Figure 6:
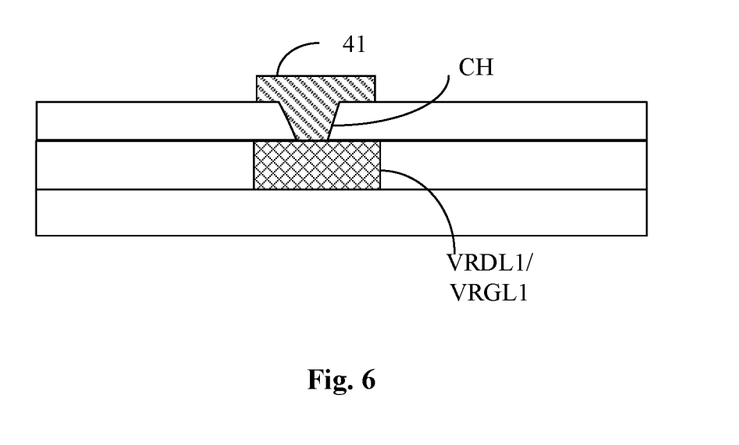
FIG. 6 is a schematic diagram of a connection between a conductive wire and a signal-line reference voltage line in FIG. 5.

In actual applications, the conductive wires are connected to the reference voltage lines through contact-holes ch in the present disclosure, as shown in FIG. 6. FIG. 6 shows a connection between one conductive wire and one signal-line reference voltage line, and connections between other conductive wires and the first signal-line reference voltage lines or the second signal-line reference voltage lines are similar to the connection shown in FIG. 6.

In FIG. 5, a region marked by the reference sign 10 is the active display area of the display pane, and a region marked by the reference sign 11 is the data-line ESD circuit, and a region marked by the reference sign 12 is the gate-line ESD circuit. In FIG. 5, eight data-line ESD circuits and eight gate-line ESD circuits are exemplarily shown. In actual applications, a quantity of the data-line ESD circuits may be more than eight and correspond to a quantity of the data lines; and a quantity of the gate-line ESD circuits may be more than eight and correspond to a quantity of the gate lines.

Resistance values of the first conductive wire 41, the second conductive wire 42, the third conductive wire 43, and the fourth conductive wire 44 are larger than a first predetermined resistance value, and the conductive wires are of large resistance values. The first determined resistance value may be determined according to actual conditions. The conductive wires having large resistance values may reduce voltages, and the reduced voltages are transferred to an ESD protection area.

In the third specific example of the reference voltage supply main circuit in the present disclosure, the resistance value of the first data-line reference voltage line VRDL1, the second data-line reference voltage line VRDL2, the first gate-line reference voltage line VRGL1, and the second gate-line reference voltage line VRGL2 are relatively small, so that reference voltages supplied to the ESD circuits arranged in each of the four sides are approximately the same. In this way, the reference voltages supplied to the gate-line ESD circuits and the reference voltages supplied to the data-line ESD circuits are different, and the reference voltages supplied to the ESD circuits arranged in each one of the four sides are almost identical, and the ESD protection effect is more reliable.

The third specific example of the reference voltage supply main circuit in the present disclosure introduces voltage drops by adding high-resistance conductive wires at the sides at which the gate-line reference voltage lines and the data-line reference voltage lines are located, so that values of the gate-line reference voltages on the gate-line reference voltage lines are changed, and a central point of a I (current)-V (voltage) characteristic curve of each gate-line ESD circuit is changed, and the I-V characteristic curve is shifted in parallel. Lengths and cross-sectional areas of the high-resistance conductive wires may be obtained by calculation, and a flat region of the I-V characteristic curve of the ESD circuit is configured to be within a required voltage range, and the ESD protection effect is reliable.

In actual applications, a design idea of the ESD circuits is as follows. In a normal operational voltage range of a signal line, the ESD circuits are in an off state to prevent a signal on the signal line from being attenuated by leak currents. When an exceptional voltage signal, a voltage of which is in an abnormal operational voltage range, exists on the signal line, transistors in the ESD circuits are turned on, so that the exceptional voltage signal is discharged to one of the reference voltage lines corresponding to the ESD circuits through discharge paths of the ESD circuits. Thus, it is desired that electrical currents in the ESD circuits when the signal in the signal line is within the normal operational voltage range are as small as possible, and it is desired that discharging capabilities of the ESD circuits when the signal in the signal line is within the abnormal operational voltage range are as strong as possible.

Values of the gate-line reference voltages on the gate-line reference voltage lines determine the central point of the I-V curve of the gate-line ESD circuits. Generally, in a case that a longitudinal axis is used to represent a current I and a traverse axis is used to represent a voltage V, the I-V curve of the gate-line ESD circuits may shift rightwards if the values of the gate-line reference voltages increase. Thus, different operational voltage ranges may be achieved by setting the values of the gate-line reference voltages.

Similarly, values of the data-line reference voltages on the data-line reference voltage lines determine the central point of the I-V curve of the data-line ESD circuits. Generally, in a case that a longitudinal axis is used to represent a current I and a traverse axis is used to represent a voltage V, the I-V curve of the data-line ESD circuits may shift rightwards if the values of the data-line reference voltages increase. Thus, different operational voltage ranges may be achieved by setting the values of the data-line reference voltages.

A display device provided in some embodiments of the present disclosure includes the above reference voltage supply main circuit.

Specifically, the display device in some embodiments of the present disclosure may further include a first signal line, a second signal line, first signal-line ESD circuits and second signal-line ESD circuits. The first signal-line ESD circuits are connected to the first signal line and the first signal-line reference voltage line. The second signal-line ESD circuits are connected to the second signal line and the second signal-line reference voltage line.

In actual applications, the first signal-line reference voltage line may be arranged at a first side or a second side of the display panel in the display device. The first signal-line reference voltage line is the data-line reference voltage line; and the first side is opposite to the second side. The second signal-line reference voltage line may be arranged at a third side or a fourth side of the display panel in the display device. The second signal-line reference voltage line is the gate-line reference voltage line; and the third side is opposite to the fourth side.

Specifically, the first signal-line reference voltage line may extend in the horizontal direction, the first side may be the upper side, and the second side may be the lower side. The second signal-line reference voltage may extend in the vertical direction, the third side may be the left side, and the fourth side may be the right side.

The above described embodiments of the present disclosure are optional embodiments. It should be noted that numerous modifications and embellishments may be made by one of ordinary skills in the art without departing from the spirit of the present disclosure, and such modifications and embellishments also fall within the scope of the present disclosure.

What is claimed is:

1. A reference voltage circuit, comprising:
N first signal-line reference voltage lines, M second signal-line reference voltage lines, and a resistance circuit,
wherein both N and M are positive integers, and at least one of the following (i) or (ii):
(i) the N first signal-line reference voltage lines are configured to receive N first signal-line reference voltages, respectively; the resistance circuit comprises M resistors; a m-th resistor of the M resistors comprises P first sub-resistors, and a first terminal of a p-th first sub-resistor of the P first sub-resistors is connected to a p-th first signal-line reference voltage line of the N first signal-line reference voltages lines, and a second terminal of the p-th first sub-resistor is connected to a m-th second signal-line reference voltage line of the M second signal-line reference voltage lines; a resistance value of each of the P first sub-resistors is larger than a resistance value of each of the N first signal-line reference voltage lines, P is a positive integer smaller than or equal to N, m is a positive integer smaller than or equal to M, and p is a positive integer smaller than or equal to P; or
(ii) the M second signal-line reference voltage lines are configured to receive M second signal-line reference voltages, respectively; the resistance circuit comprises N resistors; a n-th resistor of the N resistors includes Q second sub-resistors, and a first terminal of a q-th second sub-resistor of the Q second sub-resistors is connected to a n-th first signal-line reference voltage line of the N first signal-line reference voltages lines, and a second terminal of the q-th second sub-resistor is connected to a q-th second signal-line reference voltage line of the M second signal-line reference voltage lines; a resistance value of each of the Q second sub-resistors is larger than a resistance value of each of the M second signal-line reference voltage lines, wherein Q is an integer smaller than or equal to M, n is a positive integer smaller than or equal to N, and q is a positive integer smaller than or equal to Q.

2. The reference voltage circuit according to claim 1, wherein, each of the first sub-resistors comprises a first conductive wire, and each of the second sub-resistors comprises a second conductive wire.

3. The reference voltage circuit according to claim 2, wherein,
the first conductive wire comprised in the each of the first sub-resistors is connected to one of the first signal-line reference voltage lines or one of the second signal-line reference voltage lines through a contact hole, and
the second conductive wire comprised in the each of the second-resistors is connected to one of the first signal-line reference voltage lines or one of the second signal-line reference voltage lines through a contact hole.

4. The reference voltage circuit according to claim 1, wherein, N equals to 1, M equals to 1, and the resistance circuit comprises one resistor, and at least one of the following (i) or (ii):
(i) the first signal-line reference voltage line is configured to receive the first signal-line reference voltage; the resistor includes a first sub-resistor, a first terminal of the first sub-resistor is connected to the first signal-line reference voltage line, and a second terminal of the first sub-resistor is connected to the second signal-line reference voltage line; or,
(ii) the second signal-line reference voltage line is configured to receive the second signal-line reference voltage; the resistor comprises a second sub-resistor, a first terminal of the second sub-resistor is connected to the first signal-line reference voltage line, and a second terminal of the second sub-resistor is connected to the second signal-line reference voltage line.

5. The reference voltage circuit according to claim 1, wherein N equals to 1 and M equals to 2, the first signal-line reference voltage line is configured to receive the first signal-line reference voltage;
the resistance circuit comprises a first resistor and a second resistor,
the first resistor comprises a first first sub-resistor and the second resistor comprises a second first sub-resistor;
a first terminal of the first first sub-resistor is connected to the first signal-line reference voltage line, and a second terminal of the first first sub-resistor is connected to a first one of the two second signal-line reference voltage lines;
a first terminal of the second first sub-resistor is connected to the first signal-line reference voltage line, and a second terminal of the second first sub-resistor is connected to a second one of the two second signal-line reference voltage line.

6. The reference voltage circuit according to claim 1, wherein N equals to 1 and M equals to 2; the two second signal-line reference voltage lines are configured to receive the second signal-line reference voltages, respectively;
the resistance circuit comprises one resistor, the resistor comprises a second sub-resistor;
a first terminal of the second sub-resistor is connected to the first signal-line reference voltage line, and a second terminal of the second sub-resistor is connected to one of the two second signal-line reference voltage lines.

7. The reference voltage circuit according to claim 1, wherein N equals to 1 and M equals to 2; the two second signal-line reference voltage lines are configured to receive the second signal-line reference voltages, respectively, and the resistance circuit comprises a resistor, and the resistor comprises a first second sub-resistor and a second second sub-resistor;
a first terminal of the first second sub-resistor is connected to the first signal-line reference voltage line, and a second terminal of the first second sub-resistor is connected to a first one of the two second signal-line reference voltage lines;
a first terminal of the second second sub-resistor is connected to the first signal-line reference voltage line, and a second terminal of the second second sub-resistor is connected to a second one of the two second signal-line reference voltage lines.

8. The reference voltage circuit according to claim 1, wherein N equals to 2 and M equals to 1; the two first signal-line reference voltage lines are configured to receive the first signal-line reference voltages, respectively;
the resistance circuit comprises a resistor, the resistor comprises a first sub-resistor;
a first terminal of the first sub-resistor is connected to one of the first signal-line reference voltage lines, and a second terminal of the first sub-resistor is connected to the second signal-line reference voltage line.

9. The reference voltage circuit according to claim 1, wherein N equals to 2 and M equals to 1; the two first signal-line reference voltage lines are configured to receive the first signal-line reference voltages, respectively;
the resistance circuit comprises a resistor, the resistor comprises a first first sub-resistor and a second first sub-resistor;
a first terminal of the first first sub-resistor is connected to a first one of the first signal-line reference voltage lines, and a second terminal of the first first sub-resistor is connected to the second signal-line reference voltage line;
a first terminal of the second first sub-resistor is connected to a second one of the first signal-line reference voltage lines, and a second terminal of the second first sub-resistor is connected to the second signal-line reference voltage line.

10. The reference voltage circuit according to claim 1, wherein N equals to 2 and M equals to 1; the second signal-line reference voltage line is configured to receive the second signal-line reference voltage;
the resistance circuit comprises a first resistor and a second resistor; the first resistor comprises a first second sub-resistor, and the second resistor comprises a second second sub-resistor;
a first terminal of the first second sub-resistor is connected to a first one of the first signal-line reference voltage lines, and a second terminal of the first second sub-resistor is connected to the second signal-line reference voltage line;
a first terminal of the second second sub-resistor is connected to a second one of the first signal-line reference voltage lines, and a second terminal of the second second sub-resistor is connected to the second signal-line reference voltage line.

11. The reference voltage circuit according to claim 1, wherein N equals to 2 and M equals to 2; the two first signal-line reference voltage lines are configured to receive the first signal-line reference voltages, respectively;
- the resistance circuit comprises a first resistor and a second resistor;
- the first resistor comprises a first first sub-resistor and a second first sub-resistor;
- the second resistor comprises a third first sub-resistor and a fourth first sub-resistor;
- a first terminal of the first first sub-resistor is connected to a first one of the first signal-line reference voltage lines, and a second terminal of the first first sub-resistor is connected to a first one of the second signal-line reference voltage lines;
- a first terminal of the second first sub-resistor is connected to the first one of the first signal-line reference voltage lines, and a second terminal of the second first sub-resistor is connected to a second one of the second signal-line reference voltage lines;
- a first terminal of the third first sub-resistor is connected to a second one of the first signal-line reference voltage lines, and a second terminal of the third first sub-resistor is connected to the first one of the second signal-line reference voltage lines; and
- a first terminal of the fourth first sub-resistor is connected to the second one of the first signal-line reference voltage lines, and a second terminal of the fourth first sub-resistor is connected to the second one of the second signal-line reference voltage lines.

12. The reference voltage circuit according to claim 1, wherein N equals to 2 and M equals to 2; the two second signal-line reference voltage lines are configured to receive the second signal-line reference voltages, respectively;
- the resistance circuit comprises a first resistor and a second resistor;
- the first resistor comprises a first second sub-resistor and a second second sub-resistor;
- the second resistor comprises a third second sub-resistor and a fourth second sub-resistor;
- a first terminal of the first second sub-resistor is connected to a first one of the first signal-line reference voltage lines, and a second terminal of the first second sub-resistor is connected to a first one of the second signal-line reference voltage lines;
- a first terminal of the second second sub-resistor is connected to the first one of the first signal-line reference voltage lines, and a second terminal of the second second sub-resistor is connected to a second one of the second signal-line reference voltage lines;
- a first terminal of the third second sub-resistor is connected to a second one of the first signal-line reference voltage lines, and a second terminal of the third second sub-resistor is connected to the first one of the second signal-line reference voltage lines;
- a first terminal of the fourth second sub-resistor is connected to the second one of the first signal-line reference voltage lines, and a second terminal of the fourth second sub-resistor is connected to the second one of the second signal-line reference voltage lines.

13. The reference voltage circuit according to claim 1, wherein, at least one of (i) the first signal-line reference voltages or (ii) the second signal-line reference voltages are supplied by a reference voltage supply circuit.

14. A reference voltage supply main circuit, applied in a display device and comprising:
- a reference voltage supply circuit; and
- the reference voltage circuit according to claim 1;
- the reference voltage supply circuit is connected to at least one of the following (i) or (ii):
- (i) the N first signal-line reference voltage lines or (ii) the M second signal-line reference voltage lines, and
- the reference voltage supply circuit is configured to perform at least one of the following (i) or (ii):
- (i) supplying the N first signal-line reference voltages to the N first signal-line reference voltage lines, respectively, or (ii) supplying the M second signal-line reference voltages to the M second signal-line reference voltage lines, respectively.

15. A display device, comprising:
the reference voltage supply main circuit according to claim 14.

16. The display device according to claim 15, further comprising:
- a plurality of first signal lines, a plurality of second signal lines, a plurality of first signal-line electro-static discharge circuits, and a plurality of second signal-line electro-static discharge circuits;
- the plurality of first signal-line electro-static discharge circuits are connected to the plurality of first signal lines and the N first signal-line reference voltage lines;
- the plurality of second signal-line electro-static discharge circuits are connected to the plurality of second signal lines and the M second signal-line reference voltage lines.

17. The display device according to claim 15, wherein, the N first signal-line reference voltage lines are arranged at at least one of a first side or a second side of a display panel in the display device, and the N first signal-line reference voltage lines are data-line reference voltage lines; and the first side is opposite to the second side;
the M second signal-line reference voltage lines are arranged at at least one of a third side or a fourth side of the display panel in the display device, the M second signal-line reference voltage lines are gate-line reference voltage lines; and the third side is opposite to the fourth side.

* * * * *